United States Patent [19]

Horninger

[11] 4,074,206
[45] Feb. 14, 1978

[54] LINEAR OUTPUT AMPLIFIER FOR CHARGE-COUPLED DEVICES

[75] Inventor: Karlheinrich Horninger, Eglharting, Germany

[73] Assignee: Siemens Aktiengesellschaft, Berlin & Munich, Germany

[21] Appl. No.: 759,352

[22] Filed: Jan. 14, 1977

[30] Foreign Application Priority Data

Jan. 23, 1976 Germany .............................. 2602520

[51] Int. Cl.² ............................................. H03F 3/16
[52] U.S. Cl. ............................... 330/269; 307/221 D; 330/293
[58] Field of Search ............... 330/28, 35; 307/221 C, 307/221 D, 304; 357/24

[56] References Cited

U.S. PATENT DOCUMENTS

| | | | |
|---|---|---|---|
| 3,392,341 | 7/1968 | Burns | 330/35 X |
| 3,656,011 | 4/1972 | Weinberg | 307/221 C |
| 3,836,862 | 9/1974 | Seely et al. | 330/35 X |
| 3,946,223 | 3/1976 | Harada et al. | 307/221 D |

OTHER PUBLICATIONS

DeSimone, "Mosfet Sense Amplifier with Low-Input Impedances," *IBM Technical Disclosure Bulletin*, vol. 14, No. 8, Jan. 1972, pp. 2290-2291.

*Primary Examiner*—James B. Mullins
*Attorney, Agent, or Firm*—Hill, Gross, Simpson, Van Santen, Steadman, Chiara & Simpson

[57] ABSTRACT

A linear output amplifier for a charge coupled device arrangement in which the amplifier has a field effect switching transistor serially connected to a load element, the connection point between the transistor and the load element being the output of the amplifier and the gate terminal of the transistor being the input of the amplifier. The input of the amplifier is connected to the charge coupled device arrangement by either connecting it to the output diffusion zone of the same or by connecting it to a control electrode of the charge coupled device arrangement. Between the output of the amplifier and the input of the amplifier an additional transistor is provided with the aid of which the input can be connected to the output. Preferably, the load element is a field effect transistor and the load resistance which it provides can be varied by connecting a voltage source of desired amplitude to the gate terminal thereof.

4 Claims, 3 Drawing Figures

LINEAR OUTPUT AMPLIFIER FOR CHARGE-COUPLED DEVICES

BACKGROUND OF THE INVENTION

The invention relates to a linear output amplifier for charge coupled devices.

Charge coupled devices (CCDs) are of significance for the processing of analog signals as they can be used as analog shift registers. The conventional output circuits of CCDs are constructed as source followers, where the non-linear characteristic curve of the MOS-source follower is largely linearized with an external load resistance with the aid of a highly ohmic source resistance. The published article by D. F. Barbe "Imaging Devices Using the Charge Coupled Concept" in the Proceedings of the IEEE, Vol. 63, No. 1 Jan., 1975, pages 38 to 67, describes such an output circuit. However, the highly ohmic source resistance of this arrangement has the disadvantage that the upper cut-off frequency of the output circuit is considerably reduced. A further disadvantage lies in the fact that the amplification of such a source follower is always less than 1.

BRIEF SUMMARY OF THE INVENTION

The object of the present invention consists in providing a linear output amplifier for CCD, in which the above described disadvantages are avoided.

This object is realized by a linear output amplifier for CCDs as has been already referred to above and which is characterized by providing an amplifier having a field effect switching transistor serially connected to a load element, the connection point between the two being the output of the amplifier and the gate terminal of the switching transistor being the input of the amplifier, this gate terminal being connected to a CCD arrangement. Between the output of the amplifier and the input of the amplifier an additional transistor is provided with the aid of which the input can be connected to the output.

A fundamental advantage of the invention consists in obtaining an amplification of $v \geq 1$ on the semiconductor chip, and in that the MOS-amplifier in accordance with the invention is always operated in the linear range.

A further advantage of the invention consists in the fact that the noise of the MOS-amplifier of the invention is extremely low in that it is operated in the saturation range. Thus, advantageously, the noise of the amplifier does not decisively contribute to the overall noise of the entire chain.

In the following the invention will be explained in detail making reference to the Figures and the description.

THE DRAWINGS

FIGS. 1 and 3 schematically illustrate the circuit of a linear output amplifier in accordance with the invention and its connection to a CCD arrangement; and FIG. 2 illustrates the operating curves of the amplifier in accordance with the invention shown in FIG. 1.

DESCRIPTION OF THE PREFERRED EMBODIMENTS

Figure 1:
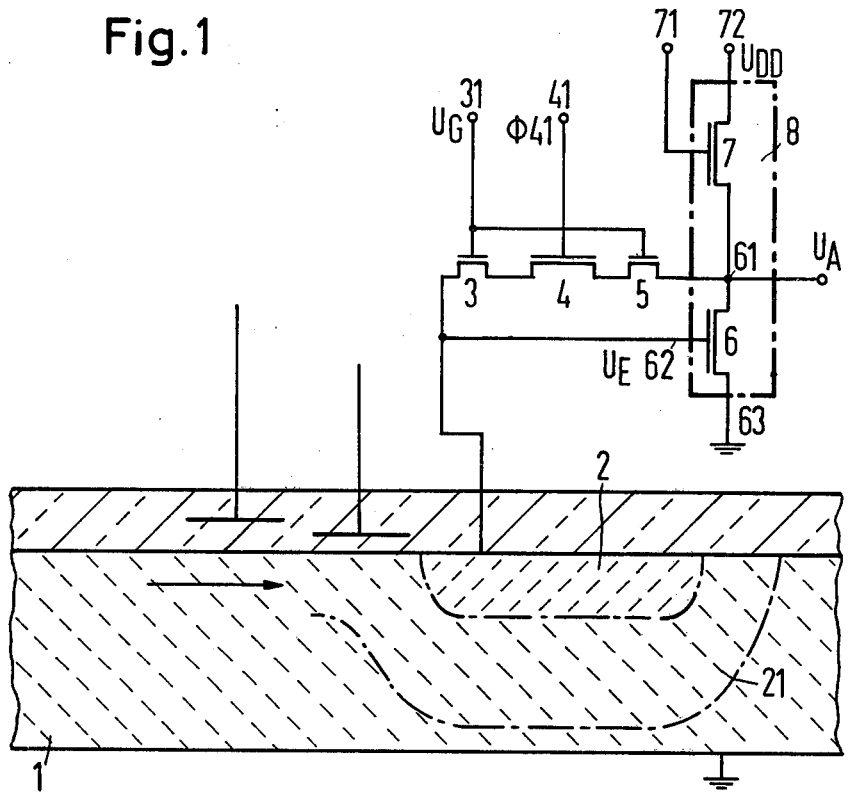

FIG. 1 illustrates the output amplifier stage of a CCD circuit. This consists of the substrate 1 composed of semiconducting material, e.g., silicon. The output diffusion zone 2 of the CCD arrangement ahead of the output stage is doped oppositely to the silicon substrate 1. This output diffusion zone 2 is connected to the gate electrode 62 of a FET switching transistor 6. This switching transistor 6, together with a FET 7 to which it is connected in series at the point 61, form the output amplifier 8. Here the gate terminal 62 represents the input and the point 61 represents the output of the output amplifier 8. The switching transistor 6 is connected on the one hand to the point 61 and on the other hand to a first supply voltage terminal 63. The transistor 7 is connected on the one hand to the point 61 and on the other hand to a second supply voltage terminal 72. The supply voltage $U_{DD}$ is present between the first supply voltage terminal 63 and the second supply voltage terminal 72. Preferably the terminal 63 is connected to ground.

The transistor 7 serves as load transistor. Its gate can be connected either to the supply voltage terminal 72 or to a separate supply voltage at the point 71. Prior to each read-out process, the amplifier is reset to its operative point. This operative point is always set to lie in the linear range of the amplifiers transmission curve. For this purpose, a FET transistor 4 is provided which can be controlled via its gate terminal 41, and in its conductive stage connects the output 61 of the output amplifier to the input 62 of the output amplifier. If the transistor 4 is brought into the conductive state with the aid of the voltage pulse $\phi_{41}$, the output 61 of the output amplifier is short-circuited with the input 62. Then the operative points P and P' represented in FIG. 2 are set up.

Figure 2:
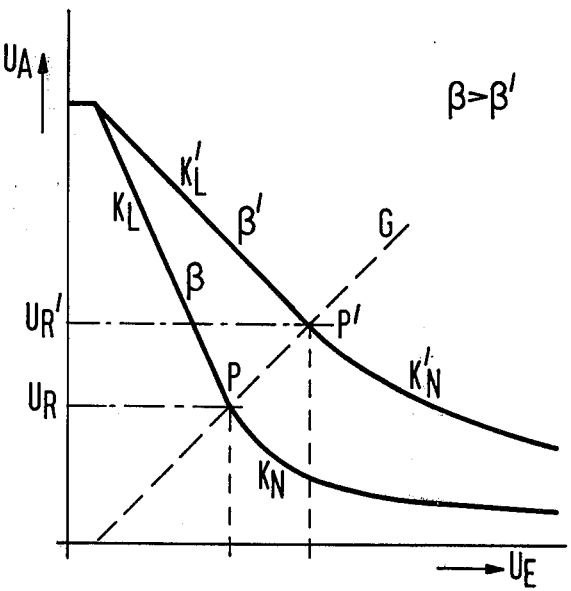

FIG. 2 illustrates the dependence of the voltage $U_A$ at the output 61 of the output amplifier upon the voltage $U_E$ connected to the input 62 of this amplifier. The operative point P, P' is characterized by the fact that the output voltage $U_A$ is equal to the input voltage $U_E$. The straight line G which is shown in FIG. 2 and which passes through the operative point P, P', divides the transmission curve into a linear range $K_L$ and $K'_L$ and into a non-linear range $K_N$ and $K'_N$. The transmission curves and their properties are described in detail by R. H. Crawford, in a book entitled "MOSFET In Circuit Design", published by McGraw Hill Book Company, 1976, USA.

With the aid of the conductive transistor 4, and the voltage pulse $\phi_{41}$ connected to its gate terminal 41, the output amplifier is brought into its operative point P, P', and at the same time the output diffusion zone 2 is biased via the transistor 7. If, then, a charge parcel passes into the space charge zone 21 of the biased PN-junction, the voltage across the gate of the transistor 6 will fall, which means that the input voltage $U_E$ at the input 62 becomes smaller. During the read-out process, the transistor 4 is blocked. For this reason, the curve $K_L$ and $K'_L$ is passed through and in fact from the operative point P, P' in the direction towards smaller $U_E$ values and thus towards higher values of the output voltage $U_A$. This means that the linear section $K_L$ and $K'_L$ of the operative curve is passed through, for which reason a linear amplification of the signal occurs.

FIG. 2 shows two curves for various resistance conditions. The more the curve $K'_L$ is displaced in the direction towards $K_L$ and thus in the direction of higher amplifications, the smaller is the voltage $U_R$ and $U'_R$ with which the PN-junction is biased. With a given CCD, therefore, it is only possible to achieve a maximum amplification in the order of 2 to 8 in normal CCD arrangements.

The transistors 3 and 5 which are illustrated in FIG. 1, which are connected in series symmetrically to the transistor 4, and whose gate terminals are commonly operable via the terminal 31, serve to ensure that no input-coupled voltage pulses $\phi_{41}$ reach the output 61 of the amplifier or the output diffusion zone 2 of the CCD. The gate terminal of these transistors is connected to a constant d.c. voltage $U_G$.

Figure 3:
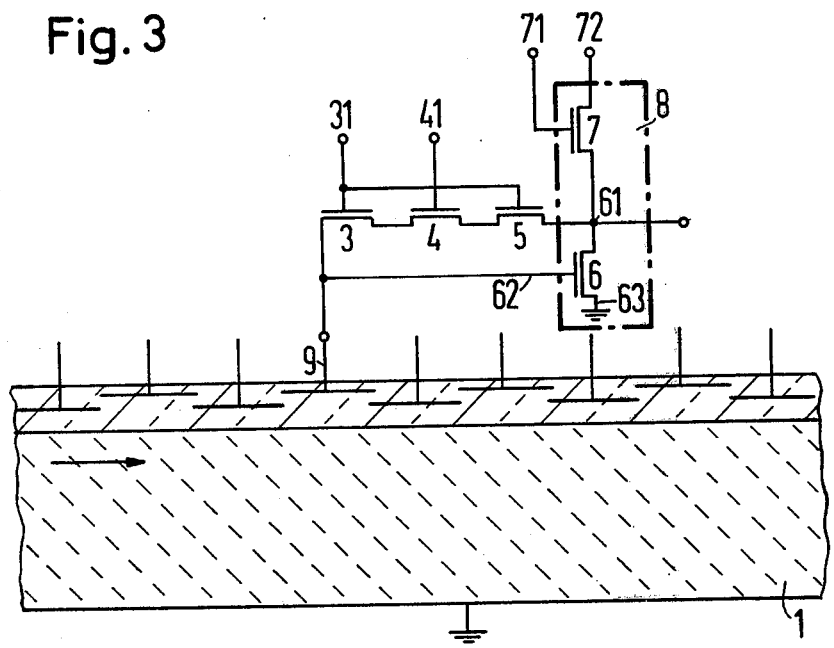

The output amplifier in accordance with the invention can also be connected to a control electrode (CCD electrode). Then, in contrast to the described arrangement, in which the output amplifier is connected to the diffusion zone, the charge can be read out non-destructively. FIG. 3 illustrates the connection of the output amplifier to a CCD control electrode. Here this electrode is referenced 9. Details of FIG. 3 which have already been described in association with FIG. 1 are referenced accordingly.

It will be apparent to those skilled in the art that many modifications and variations may be effected without departing from the spirit and scope of the novel concepts of the present invention.

I claim as my invention:

1. A linear output amplifier for a CCD arrangement comprising an FET switching transistor and a load element, connected in series to one another, the connection point being the output terminal of said amplifier, the gate terminal of said switching transistor being the input of the amplifier, said input of said amplifier being connected to said CCD arrangement, and between the output and the input of said amplifier is provided a second FET, by which the input to said amplifier can be electrically connected to the output of said amplifier, said load element being a third field effect transistor whose load resistance can be varied by connecting a voltage to the gate terminal thereof, wherein in order to prevent input-couplings of control pulses of said second transistor, a fourth FET is connected between said second transistor and said input of said amplifier, a fifth FET is connected between the said second transistor and said input of said amplifier, and the gate terminals of said second and fifth transistors being connected to a voltage source.

2. An output amplifier as claimed in claim 1, in which said transistors are transistors of the MOS field effect type.

3. An output amplifier as claimed in claim 1 in which the input of said amplifier is connected to an output diffusion zone of said CCD arrangement.

4. An output amplifier as claimed in claim 1, in which the input of said amplifier is connected to a control electrode of said CCD arrangement.

* * * * *